(12) United States Patent
Shu et al.

(10) Patent No.: US 11,985,810 B2
(45) Date of Patent: May 14, 2024

(54) SEMICONDUCTOR DEVICE AND PREPARATION METHOD THEREOF, AND MEMORY APPARATUS

(71) Applicant: CHANGXIN MEMORY TECHNOLOGIES, INC., Hefei (CN)

(72) Inventors: Yuejiao Shu, Hefei (CN); Ming-Pu Tsai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 395 days.

(21) Appl. No.: 17/468,793

(22) Filed: Sep. 8, 2021

(65) Prior Publication Data

US 2022/0085022 A1 Mar. 17, 2022

Related U.S. Application Data

(63) Continuation of application No. PCT/CN2021/103745, filed on Jun. 30, 2021.

(30) Foreign Application Priority Data

Sep. 15, 2020 (CN) .......................... 202010969793.3

(51) Int. Cl.
*H10B 12/00* (2023.01)
(52) U.S. Cl.
CPC ............. *H10B 12/30* (2023.02); *H10B 12/01* (2023.02)
(58) Field of Classification Search
CPC ................................ H10B 12/30; H10B 12/01
See application file for complete search history.

(56) References Cited

U.S. PATENT DOCUMENTS

| | | |
|---|---|---|
| 6,750,112 B2 | 6/2004 | Kieslich |
| 10,672,773 B2 | 6/2020 | Ji et al. |
| 10,978,458 B2 | 4/2021 | Ji et al. |
| 2015/0111360 A1 | 4/2015 | Kim et al. |
| 2019/0296024 A1 | 9/2019 | Ji et al. |
| 2020/0266198 A1 | 8/2020 | Ji et al. |

FOREIGN PATENT DOCUMENTS

| | | |
|---|---|---|
| CN | 1933153 A | 3/2007 |
| CN | 110364529 A | 10/2019 |
| CN | 110718550 A | 1/2020 |

*Primary Examiner* — Anthony Ho
(74) *Attorney, Agent, or Firm* — Cooper Legal Group, LLC (57) ABSTRACT

A semiconductor device, a preparation method thereof and a memory apparatus are provided. The semiconductor device includes a semiconductor substrate on which multiple strip-shaped stacked structures and a sidewall structure covering a periphery of each stacked structure are disposed, and a conductive structure is disposed on a side of the stacked structure far away from the semiconductor substrate. The stacked structure includes a conductor layer disposed on the semiconductor substrate and configured to transmit a data signal, an isolation layer disposed on a side of the conductor layer far away from the semiconductor substrate, a separation layer disposed on a side of the isolation layer far away from the semiconductor substrate and made of a low dielectric constant material, and a dielectric layer disposed on a side of the separation layer far away from the semiconductor substrate and configured to isolate the separation layer from the conductive structure.

16 Claims, 6 Drawing Sheets

SEMICONDUCTOR DEVICE AND PREPARATION METHOD THEREOF, AND MEMORY APPARATUS

CROSS-REFERENCE TO RELATED APPLICATION

This application is a continuation application of International Application No. PCT/CN2021/103745, filed on Jun. 30, 2021, and claims priority to Chinese patent application No. 202010969793.3, filed on Sep. 15, 2020 and entitled "Semiconductor Device and Preparation Method Thereof, and Memory Apparatus". The contents of International Application No. PCT/CN2021/103745 and Chinese patent application No. 202010969793.3 are hereby incorporated by reference in their entireties.

BACKGROUND

A Dynamic Random Access Memory (DRAM) is a common semiconductor memory device in a computer, and consists of multiple memory cells. Each of the memory cells usually includes a capacitor and a transistor. A grid of the transistor is connected with a word line, a drain electrode of the transistor is connected with a bit line, a source electrode of the transistor is connected with the capacitor. A voltage signal on the word line may control the transistor to be turned on or turned off, so that the data information stored in the capacitor may be read through the bit line, or the data information may be written into the capacitor through the bit line for storage.

These structures described above result in various parasitic capacitances in the DRAM, and these parasitic capacitances severely influence the use quality and lifetime of a chip.

It should be noted that the information disclosed in the background section is only used to enhance an understanding of the background of the disclosure, and thus may include information that does not constitute the prior art known to those of ordinary skill in the art.

SUMMARY

The disclosure relates to the field of semiconductor technologies, and provides a semiconductor device, a preparation method of the semiconductor device, and a memory apparatus.

According to a first aspect of the disclosure, a semiconductor device is provided. The semiconductor device may include a semiconductor substrate. Multiple strip-shaped stacked structures and a sidewall structure covering a periphery of each stacked structure may be disposed on the semiconductor substrate, and a conductive structure may be disposed on a side of the stacked structure far away from the semiconductor substrate.

The stacked structure may include a conductor layer, an isolation layer, a separation layer and a dielectric layer.

The conductor layer may be disposed on the semiconductor substrate and may be configured to transmit a data signal.

The isolation layer may be disposed on a side of the conductor layer far away from the semiconductor substrate.

The separation layer may be disposed on a side of the isolation layer far away from the semiconductor substrate and may be made of a low dielectric constant material.

The dielectric layer may be disposed on a side of the separation layer far away from the semiconductor substrate and may be configured to isolate the separation layer from the conductive structure.

According to a second aspect of the disclosure, a preparation method of a semiconductor device is provided. The preparation method may include the following operations.

A semiconductor substrate may be provided.

A conductor material layer, an isolation material layer, a separation material layer and a dielectric material layer may be sequentially formed on the semiconductor substrate.

The dielectric material layer, the separation material layer, the isolation material layer and the conductor material layer may be etched to form multiple strip-shaped stacked structures.

A sidewall structure may be formed on a periphery of each stacked structure.

A conductive structure may be formed on a side of the stacked structure far away from the semiconductor substrate.

According to a third aspect of the disclosure, a memory apparatus is provided. The memory apparatus may include a semiconductor device. The semiconductor device may include a semiconductor substrate. Multiple strip-shaped stacked structures and a sidewall structure covering a periphery of each stacked structure may be disposed on the semiconductor substrate, and a conductive structure may be disposed on a side of the stacked structure far away from the semiconductor substrate.

The stacked structure may include a conductor layer, an isolation layer, a separation layer and a dielectric layer.

The conductor layer may be disposed on the semiconductor substrate and may be configured to transmit a data signal.

The isolation layer may be disposed on a side of the conductor layer far away from the semiconductor substrate.

The separation layer may be disposed on a side of the isolation layer far away from the semiconductor substrate and may be made of a low dielectric constant material.

The dielectric layer may be disposed on a side of the separation layer far away from the semiconductor substrate and may be configured to isolate the separation layer from the conductive structure.

It should be understood that the above general descriptions and detailed descriptions below are only exemplary and explanatory and not intended to limit the disclosure.

BRIEF DESCRIPTION OF THE DRAWINGS

The accompanying drawings, which are incorporated in and constitute a part of this specification, illustrate embodiments consistent with the disclosure and, together with the specification, serve to explain the principles of the disclosure. It is apparent that the drawings in the following description are only some embodiments of the disclosure. Those skilled in the art can also obtain other drawings according to these drawings without any creative work.

IN THE DRAWINGS

1. Semiconductor substrate 2. Active region
3. Word line 31. Word line trench 32. Inter-gate dielectric layer 33. First conductive layer 34. Second conductive layer 35. Insulation layer
4. Shallow-trench isolating structure
51. Conductor adhesion material layer 52. Conductor material layer 53. Isolation material layer 54. Separation material layer 55. Dielectric material layer
6. Stacked structure 61. Conductor adhesion layer 62. Conductor layer 63. Isolation layer 64. Separation layer 65. Dielectric layer
7. Sidewall material layer 71. Sidewall structure
8. Bit line contact trench
9. Bit line

DETAILED DESCRIPTION

Example implementations will now be described more fully with reference to the accompanying drawings. However, the example implementations can be implemented in various forms, and should not be construed as being limited to the embodiments set forth herein. On the contrary, these implementations are provided so that the disclosure will be comprehensive and complete, and will fully convey the concept of the example implementations to those skilled in the art. The same reference numerals in the drawings indicate the same or similar structures, and thus the detailed descriptions thereof are omitted.

In the related art, a parasitic capacitance between Bit Lines (BLs) is widely concerned, but a parasitic capacitance may also be generated between the BL and a conductive structure on the BL. The parasitic capacitance will affect the performance of a semiconductor device, affect an operation speed and a refresh frequency.

Figure 1:
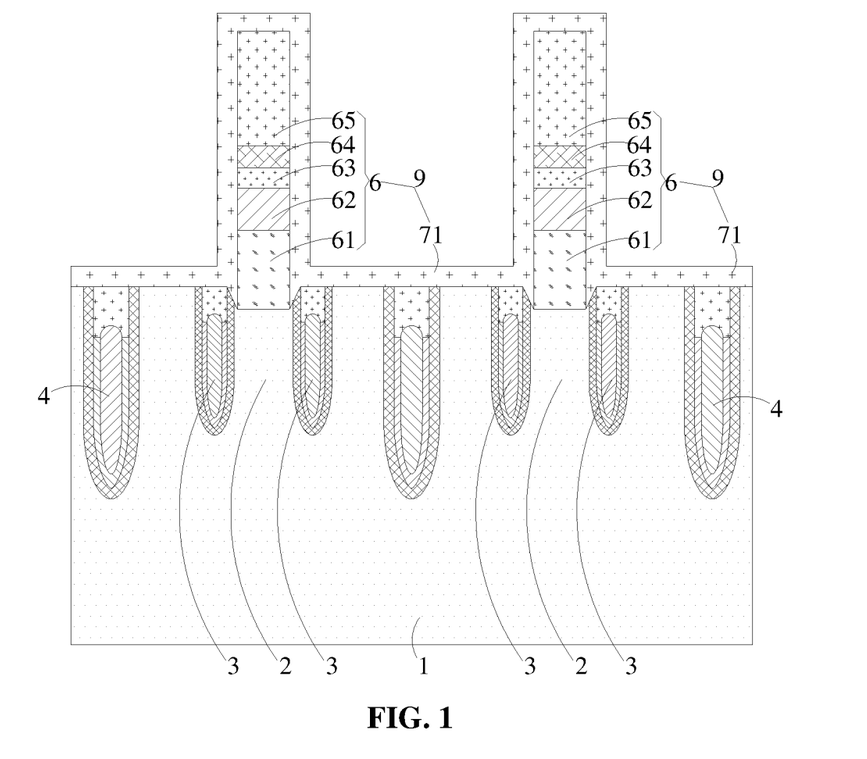
FIG. 1 illustrates a structural diagram of a semiconductor device according to an example implementation of the disclosure.

An example implementation firstly provides a semiconductor device. Referring to FIG. 1, the semiconductor device includes a semiconductor substrate 1. Multiple strip-shaped stacked structures 6 and a sidewall structure 71 covering a periphery of each stacked structure 6 are disposed on the semiconductor substrate 1, and a conductive structure (not illustrated) is disposed on a side of the stacked structure 6 far away from the semiconductor substrate 1. The stacked structure 6 includes a conductor layer 62, an isolation layer 63, a separation layer 64 and a dielectric layer 65. The conductor layer 62 is disposed on the semiconductor substrate 1 and configured to transmit a data signal. The isolation layer 63 is disposed on a side of the conductor layer 62 far away from the semiconductor substrate 1. The separation layer 64 is disposed on a side of the isolation layer 63 far away from the semiconductor substrate 1 and is made of a low dielectric constant material. The dielectric layer 65 is disposed on a side of the separation layer 64 far away from the semiconductor substrate 1 and configured to isolate the separation layer 64 from the conductive structure.

In the example implementation, word lines 3 and shallow-trench isolating structures 4 are disposed in the semiconductor substrate 1. The semiconductor substrate 1 is divided into multiple active regions 2 by the shallow-trench isolating structures 4.

Word line trenches 31 are provided in the semiconductor substrate 1, an intergate dielectric layer 32 is disposed in each word line trench 31, and the inter-gate dielectric layer 32 covers side walls and a bottom of the word line trench 31. A material of the inter-gate dielectric layer 32 may include, but is not limited to, at least one of silicon oxide or silicon nitride. The inter-gate dielectric layer 32 may be formed by adopting an atomic layer deposition process, a Plasma chemical vapor deposition process or a rapid thermal oxidation process.

A first conductive layer 33 and a second conductive layer 34 are disposed in the word line trench 31. The first conductive layer 33 covers side walls of the inter-gate dielectric layer 32 and a bottom of the inter-gate dielectric layer 32. A gap between inner side walls of the first conductive layer 33 is fully filled with the second conductive layer 34. An upper surface of the first conductive layer 33 and an upper surface of the second conductive layer 34 are both lower than an upper surface of the semiconductor substrate 1, and the upper surface of the second conductive layer 34 is higher than the upper surface of the first conductive layer 33. A material of the first conductive layer 33 may include any one of As or B-doped silicon, P or As-doped germanium, W, Ti, TiN or Ru. A material of the second conductive layer 34 may include any one of W, Ti, Ni, Al or Pt. Additionally, the material of the first conductive layer 33 is different from the material of the second conductive layer 34. The first conductive layer 33 and the second conductive layer 34 may be formed by an atomic layer deposition process or a plasma chemical vapor deposition process.

A filling insulation layer 35 is disposed in the word line trench 31. The filling insulation layer 35 covers the upper surface of the first conductive layer 33 and the upper surface of the second conductive layer 34, and fully fills the word line trench 31. A material of the filling insulation layer 35 may be any proper insulation materials including oxides (such as silicon oxide, aluminum oxide or hafnium oxide), silicon nitride, silicon oxynitride, and/or the like.

Bit line contact trenches 8 may also be provided on the semiconductor substrate 1, and a bit line 9 is disposed in each bit line contact trench 8 and protrudes from the bit line contact trench 8.

In the example implementation, multiple strip-shaped stacked structures 6 are disposed on the semiconductor substrate 1. A sidewall structure 71 covers a periphery of each stacked structure 6, and the stacked structure 6 and the sidewall structure 71 form the bit line 9 of the semiconductor device.

Specifically, the stacked structure 6 may include a conductor adhesion layer 61, a conductor layer 62, an isolation layer 63, a separation layer 64 and a dielectric layer 65. The conductor adhesion layer 61 may be disposed on the semiconductor substrate 1. A material of the conductor adhesion layer 61 may be polysilicon, and a thickness of the conductor adhesion layer is greater than or equal to 60 nm and less than or equal to 70 nm. The conductor layer 62 is disposed on a side of the conductor adhesion layer 61 far away from the semiconductor substrate 1. A material of the conductor layer 62 may be titanium, tungsten and/or the like, and a thickness of the conductor layer is greater than or equal to 25 nm and less than or equal to 30 nm. The isolation layer 63 is disposed on a side of the conductor layer 62 far away from the semiconductor substrate 1. A material of the isolation layer 63 may be silicon nitride, and a thickness of the isolation layer is greater than or equal to 8 nm and less than or equal to 12 nm, and is preferably 10 nm. The separation layer 64 is disposed on a side of the isolation layer 63 far away from the semiconductor substrate 1, a material of the separation layer 64 may be SiLK, and a thickness of the separation layer is greater than or equal to 8 nm and less than or equal to 12 nm, and is preferably 10 nm. The dielectric layer 65 is disposed on a side of the separation layer 64 away from the semiconductor substrate 1, a material of the dielectric layer 65 may be silicon nitride, and a thickness of the dielectric layer is greater than or equal to 120 nm and less than or equal to 160 nm, and is preferably 140 nm.

A dielectric constant of the SiLK is low, and is about 2.6. It is easier to control a pore diameter of the SiLK. By introducing micro voids with a diameter of 2 to 5 nm, and enabling the micro voids to be mutually sealed, a higher mechanical modulus and mechanical strength are achieved. A certain external force may be applied in subsequent processes of Chemico-Mechanical Polishing (CMP), encapsulation operations and the like, the separation layer with high mechanical strength can protect the bit line structure to further protect the whole semiconductor structure. Additionally, the chemical performance of this material is stable, and the stable performance can still be maintained at a high temperature. Therefore, the performance of the semiconductor device cannot be affected even if there is a high-temperature requirement in the subsequent process. Of course, in other example implementations of the disclosure, the material of the separation layer 64 may also be silicon dioxide, and a dielectric constant of the silicon dioxide is about 3.9. Other low dielectric constant materials can also be used, for example, may be methylsilsesquioxane (MSQ) or porous hydrogen silsesquioxane (HSQ).

In the example implementation, the sidewall structure 71 is not only disposed on the periphery of the stacked structure 6, but also covers a part of the semiconductor substrate 1 where the stacked structure 6 is not disposed. The sidewall structure 71 may cover the entire stacked structure 6. In other example implementations of the disclosure, a height of the sidewall structure 71 is at least higher than a height of the separation layer 64, that is, a distance between a side of the sidewall structure 71 far away from the semiconductor substrate 1 and the semiconductor substrate 1 is greater than a distance between the side of the separation layer 64 far away from the semiconductor substrate 1 and the semiconductor substrate 1, so that the sidewall structure 71 completely covers the separation layer 64, to prevent the separation layer 64 from being exposed to the subsequent processes. The stacked structure 6 and the sidewall structure 71 form the bit line 9.

In the example implementation, a conductive structure is disposed on a side of the bit line 9 far away from the semiconductor substrate 1. The conductive structure may include a capacitance structure and a conductive layer. The conductive layer is located on the side of the bit line 9 far away from the semiconductor substrate 1, and the conductive layer is connected to a capacitance contact. The capacitance structure is located on a side of the conductive layer far away from the semiconductor substrate 1, and the conductive layer is connected to the capacitance structure to connect the capacitance structure to the capacitance contact.

According to the semiconductor device of the disclosure, the isolation layer 63 is disposed on the side of the conductor layer 62 far away from the semiconductor substrate 1, the separation layer 64 is disposed on the side of the isolation layer 63 far away from the semiconductor substrate 1, the dielectric layer 65 is disposed on the side of the separation layer 64 far away from the semiconductor substrate 1, and the conductive structure is disposed on the side of the dielectric layer 65 far away from the semiconductor substrate 1. Through the isolation layer 63, the conductor layer 62 can be isolated from the separation layer 64. Through the dielectric layer 65, the separation layer 64 can be isolated from the conductive structure. The separation layer 64 is a low dielectric constant material. Through the separation layer 64, a parasitic capacitance generated by the conductor layer 62 and the conductive structure can be effectively reduced, so that the RC delay, crosstalk and power consumption of the semiconductor device can be reduced, and an operation speed, a refresh frequency and the like are prevented from being affected, thereby effectively reducing the impact of the parasitic capacitance on the use quality and lifetime of the semiconductor device.

Figure 2:
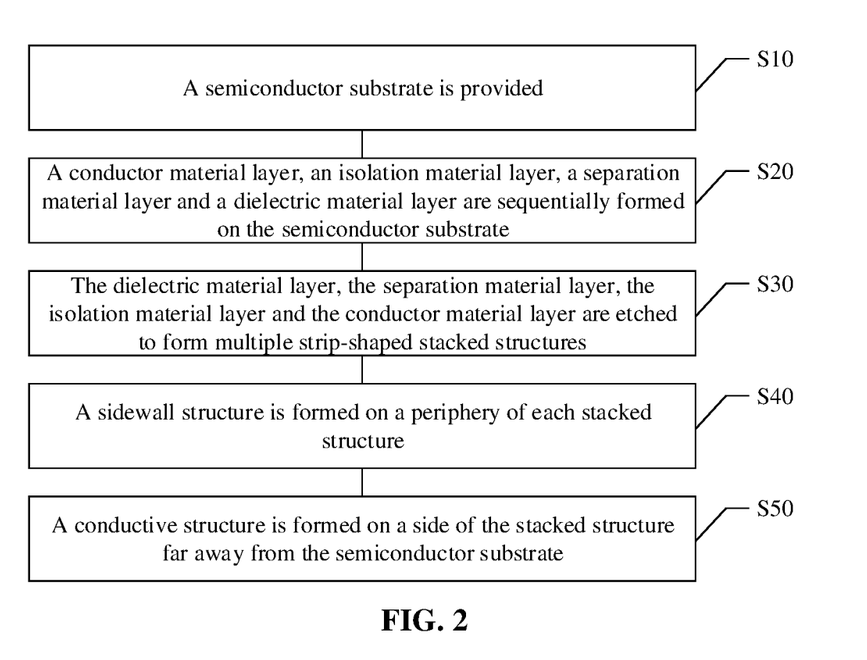
FIG. 2 illustrates a flowchart of a preparation method of a semiconductor device according to an example implementation of the disclosure.

Further, an example implementation further provides a preparation method of a semiconductor device. Referring to FIG. 2, the preparation method of the semiconductor device may include the following operations.

At S10, a semiconductor substrate 1 is provided.

At S20, a conductor material layer 52, an isolation material layer 53, a separation material layer 54 and a dielectric material layer 55 are sequentially formed on the semiconductor substrate 1.

At S30, the dielectric material layer 55, the separation material layer 54, the isolation material layer 53 and the conductor material layer 52 are etched to form multiple strip-shaped stacked structures 6.

At S40, a sidewall structure 71 is formed on a periphery of each stacked structure 6.

At S50, a conductive structure is formed on a side of the stacked structure 6 far away from the semiconductor substrate 1.

Each operation of the preparation method of a semiconductor device will be described in detail hereafter.

At S10, a semiconductor substrate 1 is provided.

Figure 3:
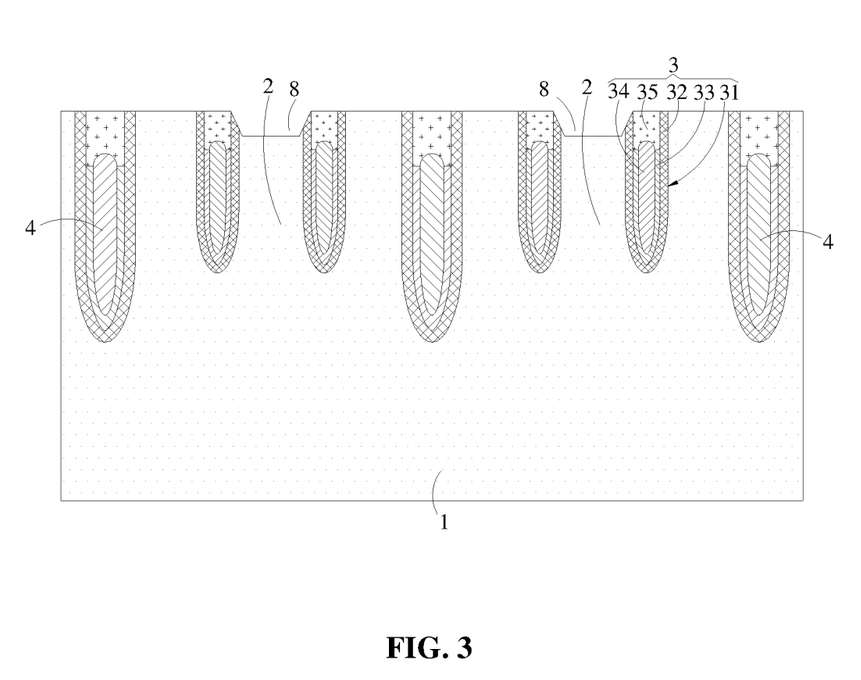
FIG. 3 illustrates a structural diagram of a semiconductor substrate of the semiconductor device according to the disclosure.

In the example implementation, as illustrated in FIG. 3, the semiconductor substrate 1 may include, but is not limited to, a monocrystalline silicon substrate, a polycrystalline silicon substrate, a gallium nitride substrate or a sapphire substrate. Additionally, if the semiconductor substrate 11 is the monocrystalline silicon substrate or the polycrystalline silicon substrate, the semiconductor substrate may also be an intrinsic silicon substrate or a slightly doped silicon substrate, and may further be an N type polycrystalline silicon substrate or a P type polycrystalline silicon substrate.

At S20, a conductor material layer 52, an isolation material layer 53, a separation material layer 54 and a dielectric material layer 55 are sequentially formed on the semiconductor substrate 1.

Figure 4:
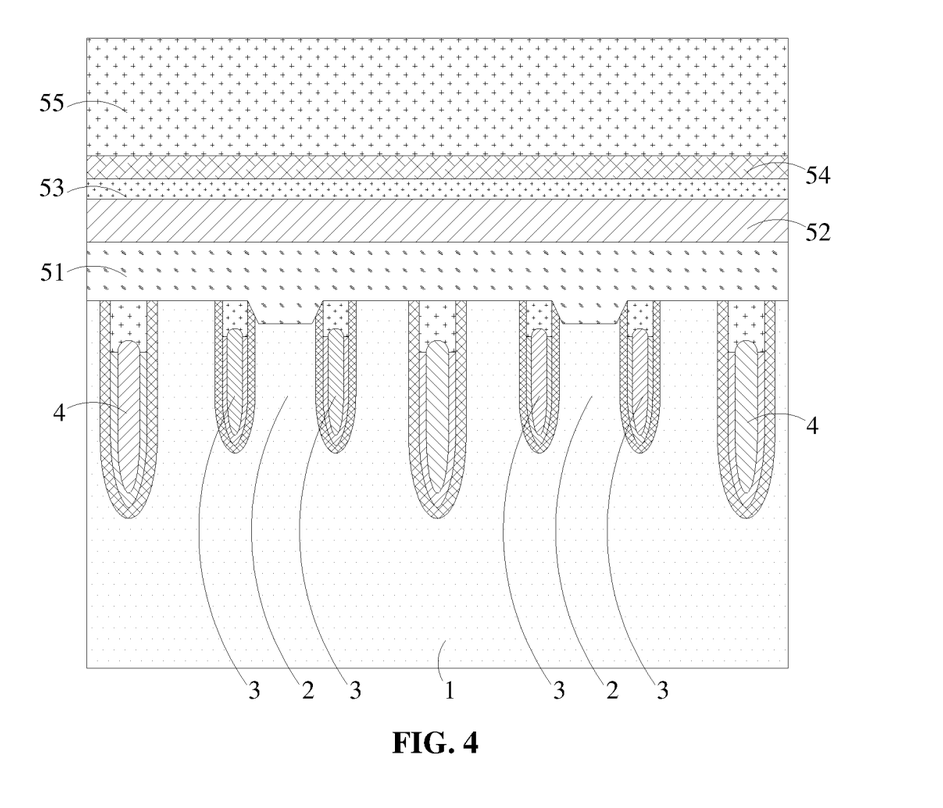
FIG. 4 illustrates a structural diagram after a conductor material layer, an isolation material layer, a separation material layer and a dielectric material layer are formed on the basis of FIG. 3.

In the example implementation, reference is made to FIG. 4.

A conductor adhesion material layer 51 is formed on the semiconductor substrate 1 through a Chemical Vapor Deposition (CVD) process. In the CVD process, deposition gas may be one or more of $Si_2H_6$, $SiH_4$, $PH_3$ or LTO520 (precursor: SiH3N(C3H7)2).

The conductor material layer 52 is formed on a side of the conductor adhesion material layer 51 far away from the semiconductor substrate 1 through a Physical Vapor Deposition (PVD) process, and a target material in the PVD process may use tungsten, titanium, and/or the like.

The isolation material layer 53 is formed on a side of the conductor material layer 52 far away from the semiconductor substrate 1 through a Low Pressure Chemical Vapor Deposition (LPCVD) process or an Atomic layer deposition (ALD) process, and a deposition material is silicon nitride. Main deposition gas is $SiCl_2H_2$ and $NH_3$.

The separation material layer 54 is formed on a side of the isolation material layer 53 far away from the semiconductor substrate 1. Specifically, SiLK and n-tetradecane are mixed according to a set proportion to form a mixed solution, the mixed solution is spin-coated, by a spin centrifugation method, onto the side of the isolation material layer 53 far away from the semiconductor substrate 1 to form a thin film with a thickness about 10 nm, and the thin film is dried in a protective atmosphere. The protective atmosphere may be nitrogen gas. Of course, helium gas can be used as the protective atmosphere. The set proportion may be that the n-tetradecane accounts for 30% to 50% of the SiLk.

The dielectric material layer 55 is formed on a side of the separation material layer 54 far away from the semiconductor substrate 1 through an LPCVD or Atomic Layer Deposition (ALD) process, and a deposition material is silicon nitride. Main deposition gas is $SiCl_2H_2$ and $NH_3$.

At S30, the dielectric material layer 55, the separation material layer 54, the isolation material layer 53 and the conductor material layer 52 are etched to form multiple strip-shaped stacked structures 6.

Figure 5:
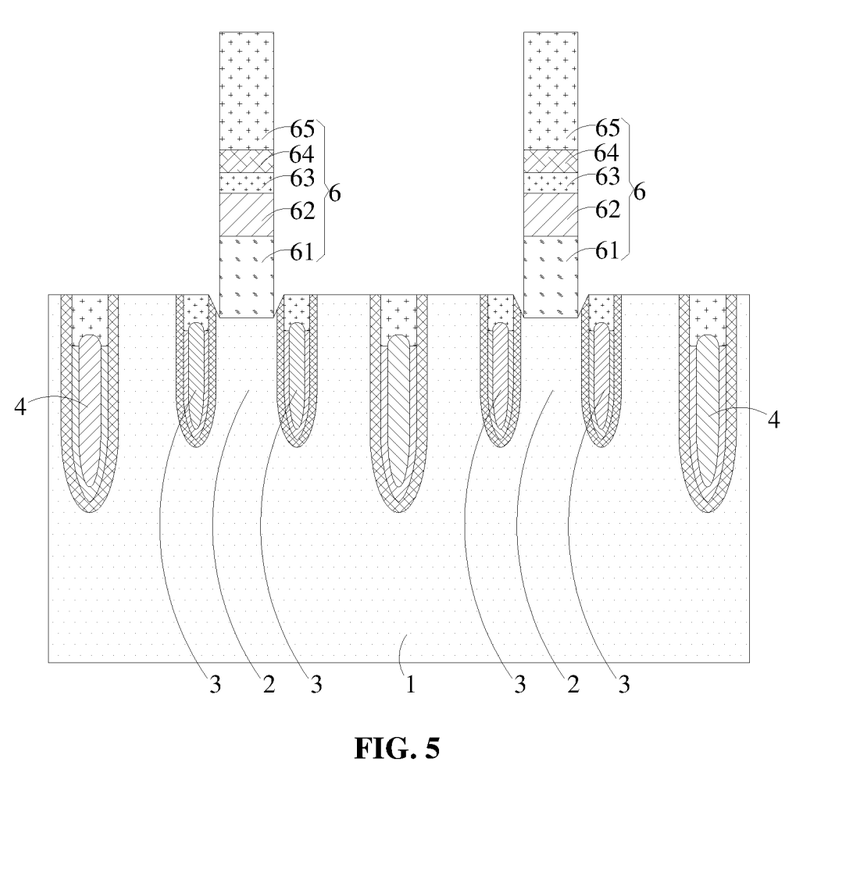
FIG. 5 is a structural diagram after forming stacked structures on the basis of FIG. 4.

In the example implementation, referring to FIG. 5, a photoresist layer may be formed on a side of the dielectric material layer 55 far away from the semiconductor substrate 1, a mask plate is disposed on the photoresist layer to expose the photoresist layer, and then a part of the photoresist layer not covered by the mask plate is removed and the remaining part of the photoresist layer is taken as a mask to dry-etch the dielectric material layer 55, the separation material layer 54, the isolation material layer 53, the conductor material layer 52 and the conductor adhesion material layer 51 so as to correspondingly form multiple strip-shaped dielectric layers 65, separation layers 64, isolation layers 63, conductor layers 62 and conductor adhesion layers 61, i.e., the multiple strip-shaped stacked structures 6 are formed.

At S40, a sidewall structure 71 is formed on a periphery of each stacked structure 6.

Figure 6:
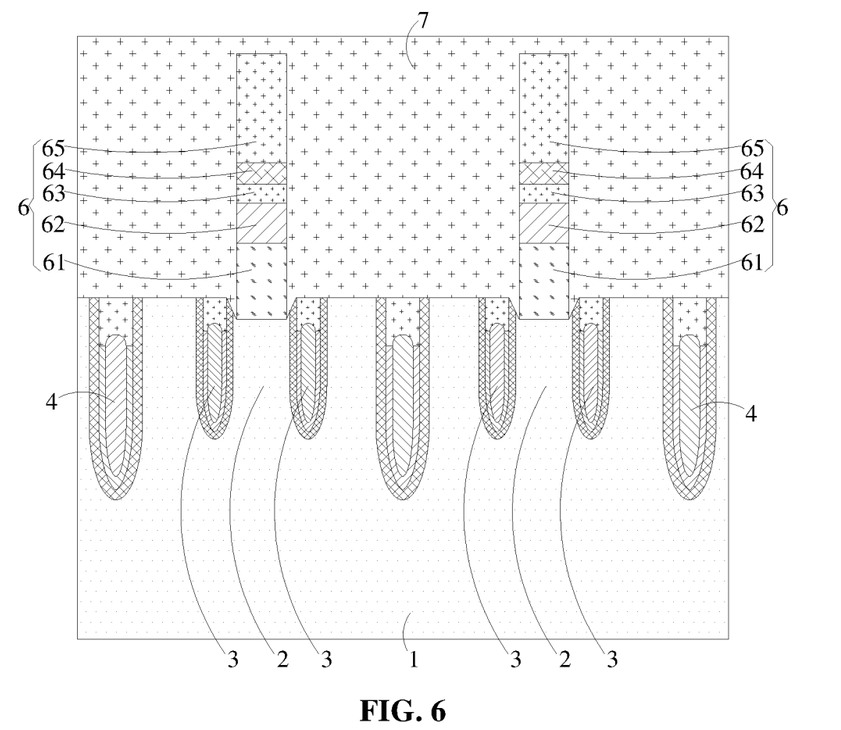
FIG. 6 is a structural diagram after forming a sidewall material layer on the basis of FIG. 5.

In the example implementation, referring to FIG. 6, a sidewall material layer 7 may be formed on the semiconductor substrate 1 and on a side of each stacked structure 6 far away from the semiconductor substrate 1 through LPCVD, and additionally, a height of the sidewall material layer 7 is higher than a height of the dielectric layer 65. Then, the sidewall material layer 7 is etched to remain a part of the sidewall material layer 7 on side walls of each stacked structure 6 and a part of the sidewall material layer 7 on the semiconductor substrate 1 to form the sidewall structure 71, a thickness of the part of the sidewall material layer 7 on the side walls of each stacked structure 6 and a thickness of the part of the sidewall material layer 7 on the semiconductor substrate 1 are substantially the same, and are greater than or equal to 7 nm and less than or equal to 9 nm. That is, the structural diagram of the semiconductor device as illustrated in FIG. 1 is formed.

The stacked structure 6 and the sidewall structure 71 form the bit line 9 of the semiconductor device.

At S50, a conductive structure is formed on a side of the stacked structure 6 far away from the semiconductor substrate 1.

In the example implementation, the conductive structure may include a capacitance structure and a conductive layer. The specific structure of the conductive structure has been described in detail above, and is not repeated herein.

Compared with the prior art, the preparation method of the semiconductor device provided by the example implementation of the disclosure achieves the same beneficial effects as the semiconductor device provided by the above example implementations, and the descriptions are not repeated herein.

Further, the present example implementation further provides a memory apparatus. The memory apparatus may include the semiconductor device in any one of the example implementations above. The specific structure of the semiconductor device has been illustrated in detail above, so that the descriptions are not repeated herein.

Compared with the prior art, the memory apparatus provided by the example implementation of the disclosure achieves the same beneficial effects as the semiconductor device provided by the above example implementations, and the descriptions are not repeated herein.

The features, structures, or characteristics described above may be combined in any suitable manner in one or more implementations, with the features discussed in each implementation being interchangeable, if possible. In the above descriptions, various specific details are provided in order to provide a thorough understanding of the implementations of the disclosure. However, it will be recognized by those skilled in the art that the technical solutions of the disclosure may be practiced without one or more of the specific details, or with other methods, components, materials, etc. Under other conditions, well-known structures, materials, or operations are not illustrated or described in detail to avoid obscuring aspects of the disclosure.

As used herein, the term "about" or "approximately" generally means within a 20%, preferably within 10%, and more preferably within 5% of a given value or range. The quantity given herein is an approximate quantity, meaning that the meaning of "about", "approximately", "substantially", and "roughly" may still be implied without particular description.

Although relative terms, such as "upper" and "lower", are used in the present specification to describe the relative relationship between one component and another component indicated in the drawings, these terms are used in the present specification only for convenience, for example, according to the directions of the examples described in the drawings. It can be understood that if a device indicated in the drawings is turned over and inverted, an "upper" component will become a "lower" component. Other relative terms such as "high", "low", "top", "bottom" and the like have similar meanings. When a structure is located "on" other structures, it may mean that the structure is integrally formed on other structures, or the structure is "directly" disposed on other structures, or the structure is "indirectly" disposed on other structures through another structure.

In this specification, the terms "a", "an", "the" and "said" are used to indicate the presence of one or more elements/components/etc. The terms "comprise", "include" and "have" are used in an open-ended inclusive sense and mean that there may be additional elements/components/etc. In addition to the listed elements/components/etc. The terms "first", "second", "third" and the like are used merely as labels and are not intended to limit the quantity of objects.

It should be understood that the disclosure shall not limit its application to the detailed structure and the arrangement manner set forth in this specification. The disclosure may have other implementations, and can be practiced and performed in various manners. The above variations and modifications fall within the scope of the disclosure. It should be understood that the disclosure disclosed and defined in this specification extends to all alternative combinations of two or more of the individual features mentioned or evident in the text and/or drawings. All of these different combinations constitute a number of alternative aspects of the disclosure. The implementations described in this specification illustrate the preferred ways known for practicing the disclosure and will enable those skilled in the art to utilize the disclosure.

The invention claimed is:

1. A semiconductor device, comprising:
a semiconductor substrate, wherein a plurality of strip-shaped stacked structures and a sidewall structure covering a periphery of each of the plurality of strip-shaped stacked structures are disposed on the semiconductor substrate, and a conductive structure is disposed on a side of each of the plurality of strip-shaped stacked structures far away from the semiconductor substrate; and
wherein each of the plurality of strip-shaped stacked structures comprises:
a conductor layer, disposed on the semiconductor substrate and configured to transmit a data signal;
an isolation layer, disposed on a side of the conductor layer away from the semiconductor substrate;
a separation layer, disposed on a side of the isolation layer away from the semiconductor substrate and being made of a low dielectric constant material; and
a dielectric layer, disposed on a side of the separation layer away from the semiconductor substrate and configured to isolate the separation layer from the conductive structure.

2. The semiconductor device of claim 1, wherein
a material of the separation layer is SiLK with a dielectric constant of 2.6, and a thickness of the separation layer is greater than or equal to 8 nm and less than or equal to 12 nm.

3. The semiconductor device of claim 1, wherein
a thickness of the isolation layer is greater than or equal to 8 nm and less than or equal to 12 nm, and a material of the isolation layer is silicon nitride.

4. The semiconductor device of claim 1, wherein
a thickness of the dielectric layer is greater than or equal to 120 nm and less than or equal to 160 nm, and a material of the dielectric layer is silicon nitride.

5. The semiconductor device of claim 1, wherein
each of the plurality of strip-shaped stacked structures further comprises:
a conductor adhesion layer, disposed between the conductor layer and the semiconductor substrate, wherein a material of the conductor adhesion layer is polycrystalline silicon, and a thickness of the conductor adhesion layer is greater than or equal to 60 nm and less than or equal to 70 nm.

6. The semiconductor device of claim 1, wherein
the conductive structure comprises:
a conductive layer, disposed on a side of each of the plurality of strip-shaped stacked structures far away from the semiconductor substrate and connected to a capacitance contact; and
a capacitance structure, disposed on a side of the conductive layer away from the semiconductor substrate and connected to the conductive layer.

7. A preparation method of a semiconductor device, comprising:
providing a semiconductor substrate;
sequentially forming a conductor material layer, an isolation material layer, a separation material layer and a dielectric material layer on the semiconductor substrate;
etching the dielectric material layer, the separation material layer, the isolation material layer and the conductor material layer to form a plurality of strip-shaped stacked structures;
forming a sidewall structure on a periphery of each of the plurality of strip-shaped stacked structures; and
forming a conductive structure on a side of each of the plurality of strip-shaped stacked structures away from the semiconductor substrate.

8. The preparation method of the semiconductor device of claim 7, wherein
forming the separation material layer comprises:
mixing SiLK with n-tetradecane according to a set proportion to form a mixed solution;
spin-coating, by a spin centrifugation method, the mixed solution onto a side of the isolation material layer away from the semiconductor substrate to form a thin film; and
drying the thin film in a protective atmosphere.

9. The preparation method of the semiconductor device of claim 8, wherein
the protective atmosphere is nitrogen gas.

10. The preparation method of the semiconductor device of claim 9, further comprising:
before forming the conductor material layer,
forming a conductor adhesion material layer on the semiconductor substrate; and
etching the conductor adhesion material layer to form a conductor adhesion layer while etching the dielectric material layer.

11. A memory apparatus, comprising
a semiconductor device, the semiconductor device comprising a semiconductor substrate, wherein a plurality of strip-shaped stacked structures and a sidewall structure covering a periphery of each of the plurality of strip-shaped stacked structures are disposed on the semiconductor substrate, and a conductive structure is disposed on a side of each of the plurality of strip-shaped stacked structures far away from the semiconductor substrate; and
wherein each of the plurality of strip-shaped stacked structures comprises:
a conductor layer, disposed on the semiconductor substrate and configured to transmit a data signal;
an isolation layer, disposed on a side of the conductor layer away from the semiconductor substrate;
a separation layer, disposed on a side of the isolation layer away from the semiconductor substrate and being made of a low dielectric constant material; and
a dielectric layer, disposed on a side of the separation layer away from the semiconductor substrate and configured to isolate the separation layer from the conductive structure.

12. The memory apparatus of claim 11, wherein
a material of the separation layer is SiLK with a dielectric constant of 2.6, and a thickness of the separation layer is greater than or equal to 8 nm and less than or equal to 12 nm.

13. The memory apparatus of claim 11, wherein
a thickness of the isolation layer is greater than or equal to 8 nm and less than or equal to 12 nm, and a material of the isolation layer is silicon nitride.

14. The memory apparatus of claim 11, wherein
a thickness of the dielectric layer is greater than or equal to 120 nm and less than or equal to 160 nm, and a material of the dielectric layer is silicon nitride.

15. The memory apparatus of claim 11, wherein
each of the plurality of strip-shaped stacked structures further comprises:
- a conductor adhesion layer, disposed between the conductor layer and the semiconductor substrate, wherein a material of the conductor adhesion layer is polycrystalline silicon, and a thickness of the conductor adhesion layer is greater than or equal to 60 nm and less than or equal to 70 nm.

16. The memory apparatus of claim 11, wherein the conductive structure comprises:
- a conductive layer, disposed on a side of each of the plurality of strip-shaped stacked structures away from the semiconductor substrate and connected to a capacitance contact; and
- a capacitance structure, disposed on a side of the conductive layer away from the semiconductor substrate and connected to the conductive layer.

* * * * *